(12) United States Patent
McKinnon

(10) Patent No.: US 8,102,177 B2
(45) Date of Patent: Jan. 24, 2012

(54) USING S-PARAMETER MEASUREMENTS TO MANAGE SAR AND TRANSMIT GAIN IN MRI

(75) Inventor: Graeme Colin McKinnon, Hartland, WI (US)

(73) Assignee: General Electric Company, Schenectady, NY (US)

( * ) Notice: Subject to any disclaimer, the term of this patent is extended or adjusted under 35 U.S.C. 154(b) by 305 days.

(21) Appl. No.: 12/415,933

(22) Filed: Mar. 31, 2009

(65) Prior Publication Data

US 2010/0244840 A1 Sep. 30, 2010

(51) Int. Cl.
*G01V 3/00* (2006.01)
(52) U.S. Cl. .................. 324/318; 324/309; 324/307
(58) Field of Classification Search .......... 324/300–322; 378/87; 600/374, 407–435; 606/41; 607/116; 382/128–131
See application file for complete search history.

(56) References Cited

U.S. PATENT DOCUMENTS

| | | | | |
|---|---|---|---|---|
| 6,005,916 | A * | 12/1999 | Johnson et al. | 378/87 |
| 7,511,492 | B2 * | 3/2009 | Sodickson et al. | 324/309 |
| 7,719,280 | B2 * | 5/2010 | Lagae et al. | 324/322 |
| 7,795,870 | B2 * | 9/2010 | Sodickson et al. | 324/309 |
| 2004/0210289 | A1 * | 10/2004 | Wang et al. | 607/116 |
| 2007/0197891 | A1 * | 8/2007 | Shachar et al. | 600/374 |
| 2007/0241753 | A1 * | 10/2007 | Sodickson et al. | 324/307 |
| 2008/0252293 | A1 * | 10/2008 | Lagae et al. | 324/318 |
| 2009/0108844 | A1 * | 4/2009 | Sodickson et al. | 324/309 |
| 2009/0248014 | A1 * | 10/2009 | Shachar et al. | 606/41 |
| 2010/0167668 | A1 * | 7/2010 | Nistler et al. | 455/101 |
| 2010/0244840 | A1 * | 9/2010 | McKinnon | 324/322 |

OTHER PUBLICATIONS

Hoult, D.I., et al.; Overcoming high-field RF problems with non-magnetic Cartesian feedback transceivers; Institute for Biodiagnostics, National Research Council Canada, 435 Ellice Avenue, Winnipeg, MB, R3B 1Y6, Canada; Magn Reson Mater Phy (2008), pp. 15-29.
Roemer, P.B., et al.; The NMR Phased Array; Magnetic Resonance in Medicine 16, p. 192-225 (1990); Received Jun. 2, 1989; revised Oct. 3, 1989.
Zhu, Yudong; Parallel Excitation With an Array of Transmit Coils; Published online in Wiley InterScience; Magnetic Resonance in Medicine 51: p. 775-784 (2004).

* cited by examiner

*Primary Examiner* — Melissa Koval
*Assistant Examiner* — Tiffany Fetzner
(74) *Attorney, Agent, or Firm* — Fletcher Yoder

(57) ABSTRACT

Systems and methods for controlling a magnetic resonance imaging system are provided. In one embodiment, a magnetic resonance imaging system includes a radio frequency coil with a plurality of conductive coil elements, control circuitry that determines, based at least in part on a measurement of scattering parameters, a plurality of forward voltages that will cause power deposition into an object within a predetermined specific absorption rate, and an amplifier configured to apply the determined plurality of forward voltages respectively to the plurality of coil elements. The control circuitry may determine the plurality of forward voltages based at least in part on an unloaded measurement of scattering parameters and a loaded measurement of scattering parameters.

18 Claims, 4 Drawing Sheets

USING S-PARAMETER MEASUREMENTS TO MANAGE SAR AND TRANSMIT GAIN IN MRI

BACKGROUND

The subject matter disclosed herein relates generally to magnetic resonance imaging systems and, more particularly, to managing specific absorption rates into patients scanned by magnetic resonance imaging systems.

Magnetic resonance imaging (MRI) systems enable imaging based on a primary magnetic field, a radio frequency (RF) pulse, and time-varying magnetic gradient fields that interact with specific nuclear components in an object, such as hydrogen nuclei in water molecules. The magnetic moments of such nuclear components may attempt to align with the primary magnetic field, but subsequently precess at a characteristic frequency known as the Larmor frequency. An RF pulse at or near the Larmor frequency of such nuclear components may cause the magnetic moments to be rotated. When the RF pulse has ended, the magnetic moments may attempt to realign with the primary magnetic field, emitting a detectable signal.

Such electromagnetic signals may penetrate the object being scanned by an MRI scanner, which is typically a human patient, and deposit thermal energy into the object. The scanner may control the electromagnetic signals so as to limit a specific absorption rate (SAR) of energy into the object. However, current techniques for controlling the electromagnetic signals to a particular SAR may be relatively inexact, and may not account for differences in electrical properties among various objects that may be scanned by the scanner.

BRIEF DESCRIPTION

Embodiments of the presently disclosed subject matter generally relate to controlling radio frequency coils in magnetic resonance imaging systems. In one embodiment, a magnetic resonance imaging system includes a radio frequency coil with a plurality of conductive coil elements, control circuitry that determines, based at least in part on a measurement of scattering parameters, a plurality of forward voltages that will cause power deposition into an object within a predetermined specific absorption rate, and an amplifier configured to apply the determined plurality of forward voltages respectively to the plurality of coil elements. The control circuitry may determine the plurality of forward voltages based at least in part on an unloaded measurement of scattering parameters and a loaded measurement of scattering parameters.

In another embodiment, a magnetic resonance imaging system includes a radio frequency coil assembly configured to obtain a measurement of scattering parameters.

In a further embodiment, a magnetic resonance imaging system includes a radio frequency coil, an amplifier configured to drive the radio frequency coil based on a control signal, and control circuitry operably connected to the amplifier and configured to provide the control signal to the amplifier. The control circuitry may be configured to receive a measurement of scattering parameters of the radio frequency coil taken when an object is not within the radio frequency coil, to receive a loaded measurement of scattering parameters of the radio frequency coil taken when the object is within the radio frequency coil, and to determine the control signal. The control signal may be determined based at least in part on the unloaded measurement of scattering parameters and the loaded measurement of scattering parameters, and may be predicted to cause the amplifier to drive the radio frequency coil to deposit an amount of power into an object within the radio frequency coil. The amount of power into the object may be within a predetermined specific absorption rate.

BRIEF DESCRIPTION OF THE DRAWINGS

These and other features, aspects, and advantages will become better understood when the following detailed description is read with reference to the accompanying drawings in which like characters represent like parts throughout the drawings, wherein.

DETAILED DESCRIPTION

Figure 1:
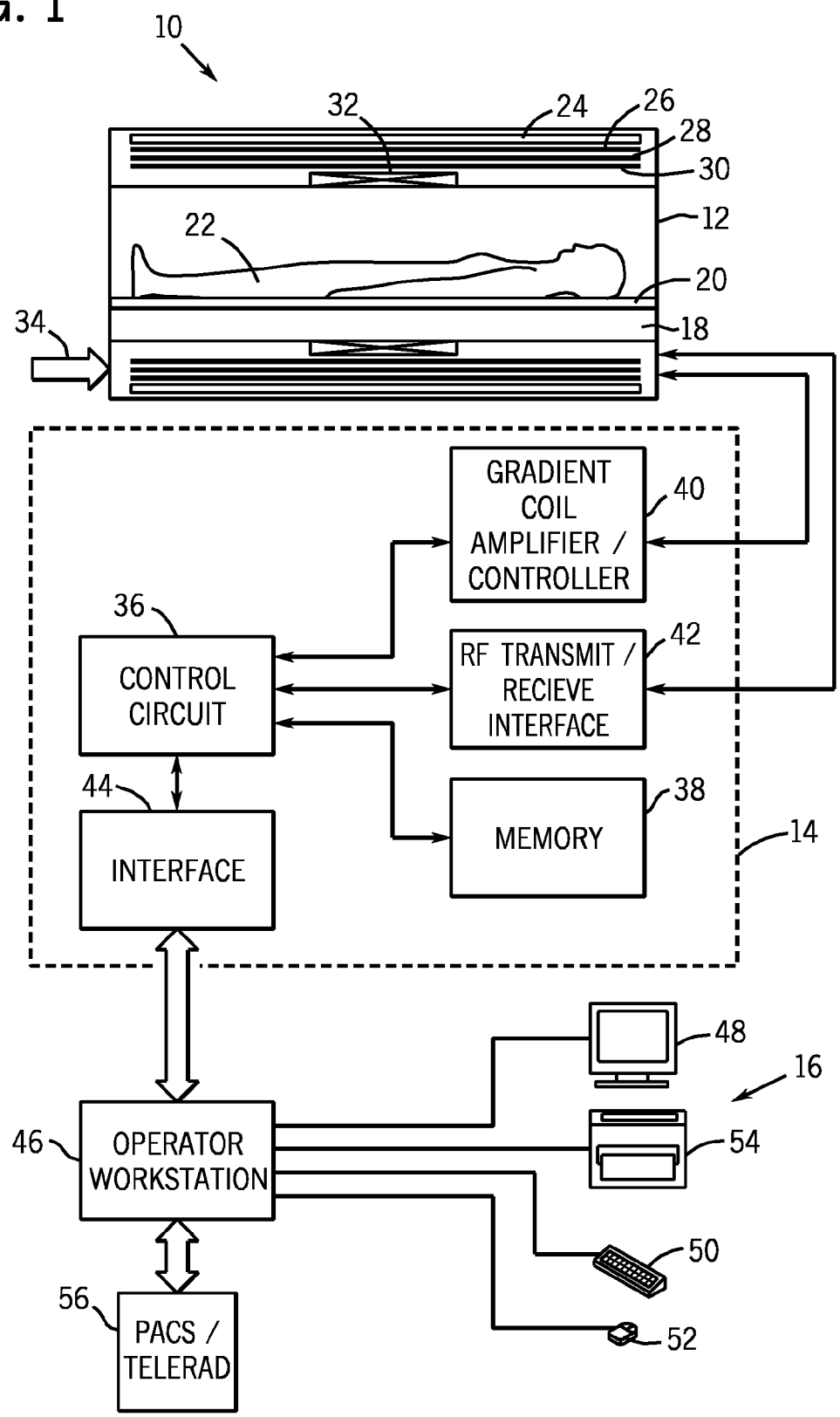
FIG. 1 is a diagrammatical representation of a magnetic resonance imaging (MRI) system configured to limit power deposited in an object to a predetermined SAR, in accordance with aspects of the present invention.

Turning now to the drawings, and referring first to FIG. 1, a magnetic resonance imaging (MRI) system 10 is illustrated diagrammatically as including a scanner 12, scanner control circuitry 14, and system control circuitry 16. While the MRI system 10 may include any suitable MRI scanner or detector, in the illustrated embodiment the system includes a full body scanner comprising an imaging volume 18 into which a table 20 may be positioned to place a patient 22 in a desired position for scanning. The scanner 12 may additionally or alternatively be configured to target certain anatomy, such as the head or neck.

The scanner 12 may include a series of associated coils for producing controlled magnetic fields, for generating radio frequency (RF) excitation pulses, and for detecting emissions from gyromagnetic material within the patient in response to such pulses. In the diagrammatical view of FIG. 1, a main magnet 24 is provided for generating a primary magnetic field generally aligned with the imaging volume 18. A series of gradient coils 26, 28 and 30 are grouped in one or more gradient coil assemblies for generating controlled magnetic gradient fields during examination sequences as described more fully below. An RF coil 32 is provided for generating RF pulses for exciting the gyromagnetic material. Power may be supplied to the scanner 12 in any appropriate manner, as indicated generally at reference numeral 34. In the embodiment illustrated in FIG. 1, the RF coil 32 may also serve as a receiving coil. Thus, the RF coil 32 may be coupled with driving and receiving circuitry in passive and active modes for receiving emissions from the gyromagnetic material and for applying RF excitation pulses, respectively. Alternatively, various configurations of receiving coils may be provided separate from RF coil 32. Such coils may include structures specifically adapted for target anatomies, such as head coil assemblies, and so forth. Moreover, receiving coils may be provided in any suitable physical configuration, including phased array coils, and so forth.

In a present configuration, the gradient coils 26, 28, and 30 may be formed of conductive wires, bars or plates which are wound or cut to form a coil structure which generates a gradient field upon application of control pulses. The placement of the coils within the gradient coil assembly may be done in several different orders and with varying configurations, and the scanner 12 may further include complementary gradient coils (in the manner described below) to shield the gradient coils 26, 28, and 30. Generally, a z-gradient coil 26 may be positioned at an outermost location, and is formed generally as a solenoid-like structure which has relatively little impact on the RF magnetic field. The gradient coils 28 and 30 may be x-axis and y-axis coils respectively.

The coils 26, 28, 30, and 32 of the scanner 12 may be controlled by external circuitry to generate desired pulsed fields, and to induce signals from the gyromagnetic material in a controlled manner. When the material, typically bound in tissues of the patient, is subjected to the primary field, individual magnetic moments of the paramagnetic nuclei in the tissue partially align with the field. While a net magnetic moment is produced in the direction of the polarizing field, the randomly oriented components of the moment in a perpendicular plane generally cancel one another. During an examination sequence, the RF coil 32 may generate an RF pulse at or near the Larmor frequency of the material of interest, resulting in rotation of the net aligned moment to produce a net transverse magnetic moment. This transverse magnetic moment precesses around the main magnetic field direction, emitting RF signals that are detected by the scanner 12 and processed for reconstruction of the desired image.

The gradient coils 26, 28, and 30 may serve to generate precisely controlled magnetic fields, the strength of which vary over a predefined field of view, typically with positive and negative polarity. When each gradient coil 26, 28, or 30 is energized with known electric current, the resulting magnetic field gradient is superimposed over the primary field and produces a desirably linear variation in the axial component of the magnetic field strength across the field of view. The field may vary linearly in one direction, but may be homogenous in the other two. The three gradient coils 26, 28, and 30 have mutually orthogonal axes for the direction of their variation, enabling a linear field gradient to be imposed in an arbitrary direction with an appropriate combination of the three gradient coils 26, 28, and 30.

The pulsed gradient fields may perform various functions integral to the imaging process. Some of these functions are slice selection, frequency encoding and phase encoding. These functions can be applied along the x-, y- and z-axes of the original coordinate system or along other axes determined by combinations of pulsed currents applied to the individual field coils.

The slice select gradient field may determine a slab of tissue or anatomy to be imaged in the patient, and may be applied simultaneously with a frequency selective RF pulse to excite a known volume of spins that may precess at the same frequency. The slice thickness may be determined by the bandwidth of the RF pulse and the gradient strength across the field of view.

The frequency encoding gradient, also known as the readout gradient, is usually applied in a direction perpendicular to the slice select gradient. In general, the frequency encoding gradient is applied before and during the formation of the MR echo signal resulting from the RF excitation. Spins of the gyromagnetic material under the influence of this gradient are frequency encoded according to their spatial position along the gradient field. By Fourier transformation, acquired signals may be analyzed to identify their location in the selected slice by virtue of the frequency encoding.

Finally, the phase encode gradient is generally applied before the readout gradient and after the slice select gradient. Localization of spins in the gyromagnetic material in the phase encode direction is accomplished by sequentially inducing variations in phase of the precessing protons of the material using slightly different gradient amplitudes that are sequentially applied during the data acquisition sequence. The phase encode gradient permits phase differences to be created among the spins of the material in accordance with their position in the phase encode direction.

A great number of variations may be devised for pulse sequences employing the exemplary gradient pulse functions described above, as well as other gradient pulse functions not explicitly described here. Moreover, adaptations in the pulse sequences may be made to appropriately orient the selected slice and the frequency and phase encoding to excite the desired material and to acquire resulting MR signals for processing.

The coils of the scanner 12 are controlled by the scanner control circuitry 14 to generate the desired magnetic field and radiofrequency pulses. In the diagrammatical view of FIG. 1, the control circuitry 14 thus includes a control circuit 36 for commanding the pulse sequences employed during the examinations, and for processing received signals. The control circuit 36 may include any suitable programmable logic device, such as a CPU or digital signal processor of a general purpose or application-specific computer. Further, the control circuit 36 may include memory circuitry 38, such as volatile and/or non-volatile memory devices for storing physical and logical axis configuration parameters, examination pulse sequence descriptions, acquired image data, programming routines, and so forth, used during the examination sequences implemented by the scanner 12.

Interface between the control circuit 36 and the coils of the scanner 12 may be managed by amplification and control circuitry 40 and by transmission and receive interface circuitry 42. The amplification and control circuitry 40 includes amplifiers for each gradient field coil 26, 28, and 30 to supply drive current in response to control signals from the control circuit 36. The receive interface circuitry 42 includes additional amplification circuitry for driving the RF coil 32. Moreover, where the RF coil 32 serves both to emit the RF excitation pulses and to receive MR signals, the receive interface circuitry 42 may include a switching device for toggling the RF coil between active or transmitting mode, and passive or receiving mode. A power supply, denoted generally by reference numeral 34 in FIG. 1, is provided for energizing the primary magnet 24. Finally, the scanner control circuitry 14 includes interface components 44 for exchanging configuration and image data with the system control circuitry 16.

The system control circuitry 16 may include a wide range of devices for facilitating interface between an operator or radiologist and the scanner 12 via the scanner control circuitry 14. In the illustrated embodiment, for example, an operator workstation 46 is provided in the form of a computer workstation employing a general purpose or application-specific computer. The operator workstation 46 also typically includes memory circuitry for storing examination pulse sequence descriptions, examination protocols, user and patient data, image data, both raw and processed, and so forth. The operator workstation 46 may further include various interface and peripheral drivers for receiving and exchanging data with local and remote devices. In the illustrated embodiment, such devices include a monitor 48, a conventional computer keyboard 50, and an alternative input device such as a mouse 52. A printer 54 is provided for generating hard copy output of documents and images reconstructed from the acquired data. In addition, the system 10 may include various local and remote image access and examination control devices, represented generally by reference numeral 56 in FIG. 1. Such devices may include picture archiving and communication systems, teleradiology systems, and the like.

Figure 2:
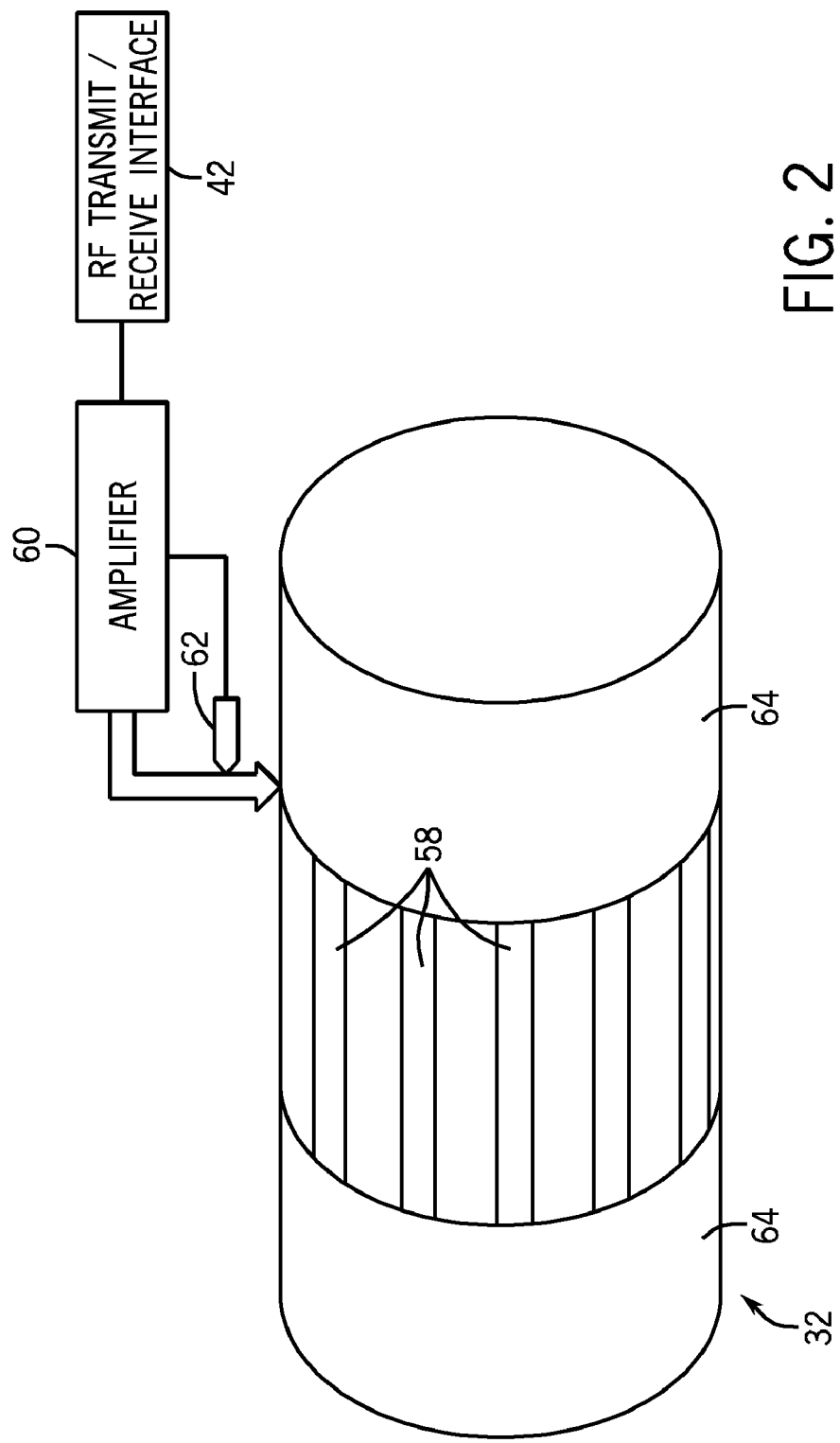
FIG. 2 is a schematic illustrating an embodiment of a radio frequency (RF) coil of the MRI system of FIG. 1, in accordance with aspects of the present invention.

FIG. 2 is a schematic view of the RF coil 32 and related circuitry. The RF coil 32 may include an array of coil elements 58, each of which may be controlled by one or more amplifiers 60, which transmit and receive signals to and from the RF transmit and receive interface 42. The coil elements 58 may transmit a radio frequency (RF) signal and receive a signal in response, when a signal from the amplifier 60 is applied. The RF transmit and receive interface 42 may ascertain the input voltage to each conductive rung 58 with a plurality of sensors 62. The sensors 62 may detect the amount of forward voltage $V_f$ applied to the coil elements 58, as well as the amount of reflected voltage $V_r$ reflected from the coil elements 58. Electrically coupled to the coil elements 58 by way of a capacitive element, shield extensions 64 may serve to minimize interference to the coil elements 58 from extraneous electromagnetic sources.

For reasons described below, the RF coil 32 may be configured to perform unloaded scattering parameter (S-parameter) measurements of the RF coil 32 as well as loaded S-parameter measurements including an object, such as a patient, within the RF coil 32. Because S-parameters may represent the characteristics of a multiport network, such as the RF coil 32, S-parameter measurements may be employed to determine and manage energy deposition by the RF coil 32 into an object, such as a patient. Additionally, because the characteristics of the multiport network formed by the RF coil 32 may change based on the characteristics of the object in the scanner 12, the S-parameter measurements may be taken each time the object is repositioned.

The RF coil 32 may perform the S-parameter measurements using phase coherent exciters and/or receivers. For example, RF transmit cables may connect the amplifier 60 to the coil elements 58. Receivers may be connected to power couplers on the RF transmit cables, and circulators may be incorporated into each RF transmit cable (which may allow each coil element 58 port to experience a matched termination). By transmitting RF pulses to each coil element 58 sequentially, a complex ratio of forward and reflected voltages may be determined by simultaneously measuring reflected power at every coil element 58, which may enable a measurement of S-parameters.

The coil elements 58 may deposit energy into any object disposed within the RF coil 32. An average specific absorption rate (SAR) of the energy deposited over an object may be understood as the total thermal energy deposited into the object, divided by a weight of the object. The following volume integral ratio may describe the SAR into an object:

$$SAR(t) = \frac{1}{2}\int \sigma(x)|E(x,t)|^2 dv \Big/ \int \rho(x)dv = \qquad (1)$$

$$\frac{1}{2}\int \sigma(x)E(x,t)E^*(x,t)dv \Big/ \int \rho(x)dv.$$

In the equation above, $\sigma(x)$ is the conductivity, $\rho(x)$ is the density, $E(x,t)$ is the electric field, and * indicates a complex conjugate. In the present disclosure, $E(x,t)$ represents the time-harmonic electric field, in which the time variation is slow due to modulation by an RF pulse envelope. As such, E may be assumed to represent a single frequency, and the bandwidth of the RF pulse envelope may be much less than the frequency. For example, the ratio of the frequency to bandwidth may be approximately 10,000:1.

To simplify Equation (1) above, weight may be described in the following manner:

$$w = \int \rho(x)dv \qquad (2),$$

where w denotes the weight of the object that may be located within the scanner 12 and, consequently, within the RF coil 32.

For a given loading condition, electric fields that may be produced by one of the coil elements 58 may be proportional to the current I(t) that may be flowing in the coil element 58. Such an electric field $E(x,t)$ may be caused by voltages across impedances in the coil element 58 and by an alternating magnetic field, which may be produced by the current flowing through the coil element 58. Accordingly, the electric field for each coil element 58 may be described by the following:

$$E(x,t) = I(t)e(x) \qquad (3),$$

where e(x) represents the electric field for a unit current in the coil element 58. For multiple coil elements, such as the array of coil elements 58 found in the RF coil 32, the electric field for an $n^{th}$ coil element 58 may be given by:

$$E^{(n)}(x,t) = I^{(n)}(t)e^{(n)}(x) \qquad (4).$$

The equation above illustrates that the I(t) current waveform may be completely different for each coil element 58, as may occur with the use of accelerated parallel transmit pulses. However, the above equations may also be applied to a simpler RF shimming situation, whereby the I(t) current waveforms may all be identical in form, but may differ by a complex scaling factor. For example, Equation (4) may be applied to the SAR formulation of Equation (1). Thus, a SAR equation for a multiport system such as the RF coil 32 may be described as follows:

$$SAR(t) = \frac{1}{2w}\int \sigma(x) \sum_n E^{(n)}(x,t) \sum_m E^{*(m)}(x,t) dv \qquad (5)$$

$$= \frac{1}{2w}\sum_n\sum_m I^{(n)}(t)I^{*(m)}(t)\int \sigma(x)e^{(n)}(x)e^{*(m)}(x)dv.$$

To simplify Equation (5), a variable $\phi_{nm}$ may be defined as follows:

$$\phi_{nm} = \int \sigma(x)e^{(n)}(x)e^{*(m)}(x)dv \qquad (6).$$

If $I^{(n)}(t)$ is treated as a vector I(t), and $\phi_{nm}$ is incorporated into a matrix $\Phi$, the SAR expression may be described as follows:

$$SAR(t) = \frac{1}{2w}I'(t)\Phi I(t), \qquad (7)$$

where I'(t) indicates the conjugate transpose of I(t). In parallel transmit applications, the RF pulse waveform vector I(t) may be chosen to control the spatial form of the magnetic field of the RF coil 32 (or, more particularly, the rotating component of the magnetic field that is responsible for exciting the spins). Moreover, Equation (7) may be incorporated into the I(t) optimization process that may take place in the RF transmit or receive interface 42 to control the powered deposition. Rather than calculate the $\Phi$ matrix via electric field simulations in the manner of Equation (6), the following disclosure describes another manner of calculating the $\Phi$ matrix. It should be understood that the $\Phi$ matrix may differ for every object, and thus every patient. As such, calculating via an electric field simulation approach may be impractical, since it would require knowledge of the 3-dimensional, spatially dependent electrical properties of the object.

As noted above, SAR represents the power deposited in an object divided by the weight of the object. Since weight can easily be measured, based on the present disclosure, power deposition in the object may be predicted when currents that may flow through each coil element 58 are known. It should be appreciated, however, that the amplifier 60 may not directly control the coil currents, instead controlling an output forward voltage $V_f$. A portion of the forward voltage $V_f$ may be reflected at the drive port of each coil element 58 (referred to herein as $V_r$). Thus, the port voltage of each coil element 58 may be the sum of the forward voltage $V_f$ and reflected voltage $V_r$. With knowledge of the port voltage, one may control the current at each coil element 58, as described further below.

A well established formulism for forward and reflected voltage waveforms from multiport devices may involve using S-parameters. If the vector of forward voltages and reflective voltages are represented by $V_f(t)$ and $V_r(t)$, the voltages may be related by a scattering matrix S via the following relationship:

$$V_r(t) = SV_f(t) \tag{8}$$

The port voltage vector $V_{in}(t)$ may be illustrated as the sum of the forward and reverse or reflected voltage vectors in the following equation:

$$V_{in}(t) = V_f(t) + V_r(t) = (1+S)V_f \tag{9}$$

In Equation (9), 1 represents a unitary matrix of the same dimensions as S. From the S-parameter formulism, current entering the ports $I_{in}(t)$ of the coil elements 58 may be described by the following equation:

$$I_{in}(t) = (V_f(t) - V_r(t))/Z_0 = (1-S)\frac{V_f(t)}{Z_0}, \tag{10}$$

where $Z_0$ is the characteristic impedance of the feed cable and terminating loads.

From Equations (9) and (10), the power entering the coil element 58 may be calculated by the following equation:

$$P(t) = \frac{1}{2}V'_{in}(t)I_{in}(t) \tag{11}$$
$$= \frac{1}{2}V'_f(t)(1+S)'(1-S)V_f(t)/Z_0.$$

Resistive losses in the coil element 58 may be represented as the real part of vector P(t). However, the S-parameter approach of Equation (11) combines both the coil element 58 and object power, whereas the electric field equations may represent the power deposited in an object such as a patient. As such, a correction should be made for losses in the coil element 58. Additionally, power should be calculated at a given coil current; however, Equation (11) specifies power at a given set of amplifier voltages. Hence, the present disclosure describes a manner of calculating the coil currents in the coil elements 58 from the forward voltages $V_f(t)$.

Figure 3:
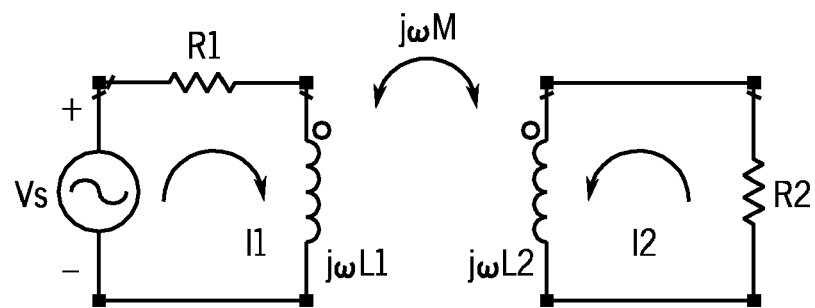
FIG. 3 is a circuit diagram representing the RF coil of FIG. 2.

FIG. 3 is a circuit diagram representing a coil element 58 that may inductively couple power into a passive object. In the diagram of FIG. 3, R1 represents a resistance of the coil element 58 and $j\omega L1$ represents an induction of the coil element 58. Similarly, R2 represents the resistance of an object within the RF coil 32 and $j\omega L2$ represents the induction of the object. Mutual inductance is illustrated as $j\omega M$. Mesh equations for the circuit of FIG. 3 may be given by:

$$Vs = (R1+j\omega L1)I1 + j\omega MI2, \text{ and}$$

$$0 = j\omega MI1 + (R2+j\omega L2)I2. \tag{12}$$

By eliminating the current term I2, the following equation may be written:

$$Vs = \left(R1 + j\omega L1 + \frac{\omega^2 M^2}{R2 + j\omega L2}\right)I1. \tag{13}$$

In the context of a patient within the RF coil 32, the patent inductance term may be assumed to be negligible. In other words, the presence of the patient may be assumed to negligibly change the inductance inherent to the system. On the other hand, the patient resistance term R2 may be assumed to be significant with respect to the resistance R1 of each RF coil 32. Patient loading effects may thus be modeled by adding an additional resistance to the unloaded resistance of the RF coil 32, such that total resistance may be given by the following equation:

$$\hat{R}1 = R1 + \frac{\omega^2 M^2}{R2}. \tag{14}$$

It should be noted that for a given current through the coil element 58, and thus $B_1$, the patient losses may increase as the patient resistance term R2 decreases, due to the inductive coupling effect. In contrast, the coil losses may increase as the unloaded coil resistance increases.

Figure 4:
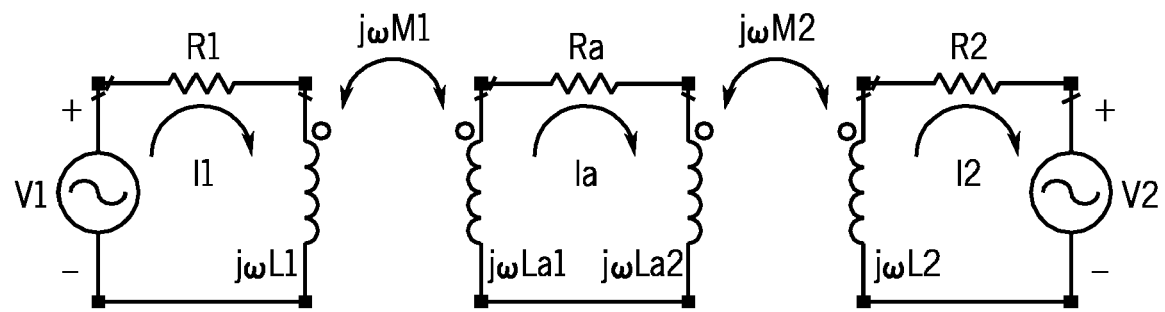
FIG. 4 is a circuit diagram illustrating indirect coupling that may occur between an object in the scanner of the MRI system of FIG. 1 and an active coil of the RF coil of FIG. 2, in accordance with aspects of the present invention.

FIG. 4 is a circuit diagram illustrating indirect coupling to an active coil, representing coupling between two active coil elements 58 via a passive object, such as a patient. As illustrated in FIG. 4, the two coil elements 58 may be prepared such that they do not have direct mutual inductance; rather, coupling may only arise in the presence of an additional object, into which power is deposited by both coil elements 58. In the diagram of FIG. 4, R1 represents a resistance and $j\omega L1$ represents an induction of a first coil element 58. Similarly, R2 represents a resistance and $j\omega L2$ represents the induction of a second coil element 58. The variable Ra represents a resistance and $j\omega La1$ and $j\omega La2$ represent inductance of an object within the RF coil 32 between the first and second coil elements 58. Mutual inductances between the object and the first and second coil elements 58 are respectively illustrated as $j\omega M1$ and $j\omega M2$.

For the situation illustrated in FIG. 4, the following equations may be written:

$$V1 = (R1+j\omega L1)I1 - j\omega M1Ia$$

$$0 = -j\omega M1I1 + (Ra+j\omega La1+j\omega La2)Ia - j\omega M2I2$$

$$V2 = -j\omega M2Ia + (R2+j\omega L2)I2 \tag{15}$$

By eliminating the current Ia, and by assuming that La1 and La2 are insignificant, the following equations may be written:

$$V1 = \left(R1 + j\omega L1 + \frac{\omega^2 M1^2}{Ra}\right)I1 + \frac{\omega^2 M1M2}{Ra}I2 \qquad (16)$$

$$V2 = \frac{\omega^2 M1M2}{Ra}I1 + \left(R2 + j\omega L2 + \frac{\omega^2 M2^2}{Ra}\right)I2.$$

Equations (15) and (16) are representative of an impedance matrix containing off-diagonal terms. In addition to the extra resistance term, in any one coil element 58, there may also be an extra voltage term depending on the current in the coupled coil element 58. The impedance matrix that may result may be described as the sum of a coil term and an object term:

$$Z = \begin{bmatrix} R1 + j\omega L & 0 \\ 0 & R2 + j\omega L2 \end{bmatrix} + \frac{\omega^2}{Ra}\begin{bmatrix} M1^2 & M1M2 \\ M1M2 & M2^2 \end{bmatrix} \qquad (17)$$

$$= Zc + Zo.$$

As shown in Equation (17) above, it should be noted that Zo appears to be very similar to the $\Phi$ matrix, which may be used to calculate the SAR in Equation (7).

Figure 5:
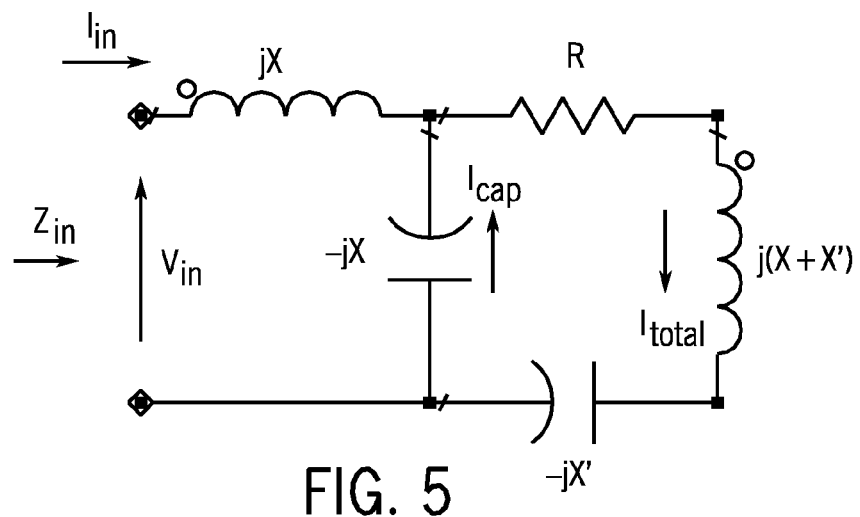
FIG. 5 is a circuit diagram illustrating parallel resonance that may occur between elements of the RF coil of FIG. 2 and an object in the scanner of the MRI system of FIG. 1, in accordance with aspects of the present invention.

FIG. 5 is a circuit diagram illustrating a parallel resonant circuit, which may represent electrical characteristics of one of the coil elements 58. In the circuit diagram of FIG. 5, R represents a resistance and X represents a reactance of the coil element 58. A variable $Z_{in}$ represents a total input impedance to the coil element 58. As illustrated in FIG. 5, if the capacitive and inductive reactance terms are chosen as indicated by the diagram, the input impedance to the coil element 58 may be given by the following equation:

$$Z_{in} = \frac{X^2}{R}. \qquad (18)$$

For a given value of coil resistance R, the reactance X may be chosen to match the coil to the source and feed cable (e.g., approximately 50 ohms). The total current $I_{total}$ that may flow in the coil may be the sum of the input current $I_{in}$ and the current flowing through the port capacitor $I_{cap}$. As such, the total current flowing in the coil may be described in the follow equation:

$$I_{total} = I_{in} + I_{cap} \qquad (19).$$

It should be understood that the total current $I_{total}$ determines the magnetic field produced by the coil element 58. Summing the voltages around the input loop may produce the following equation:

$$V_{in} = jXI_{in} - (-jX)I_{cap} \qquad (20)$$

$$= jXI_{total}.$$

The result of Equation (20) should be noted, as it indicates that the coil current is directly proportional to port voltage $V_{in}$ and, hence, independent of the load R. Further, it should be appreciated that Equations (19) and (20) depend on Kirchoff's current and voltage laws respectively. As such, it should be appreciated that Equation (20) also holds for coupled coils. Written in vector form for use in a transmit array of coil elements 58, such as the RF coil 32, the following equation may be written:

$$V_{in} = jXI \qquad (21).$$

In Equation (21) above, X represents a diagonal matrix containing the port reactances. Because it may not be strictly necessary to use a series matching inductance of reactance jX, such a reactance may be removed. For such instances, the voltage across the port capacitor is $V_{in}$, and the current continuity Equation (19) above may be rewritten as:

$$-\frac{V_{in}}{-jX} + I_{in} = I_{total}. \qquad (22)$$

Equation (22) may be further rewritten in a vector form for an array of coil elements 58, such as the RF coil 32, with the following equation:

$$V_{in} + jXI_{in} = jXI \qquad (23).$$

Using the equations above, the current in the coil elements 58 of the RF coil 32 may be controlled by applying specific forward voltages via the amplifier 60. When each of the coil elements 58 includes a port matching inductor, Equations (9) and (21) may be employed to achieve a given RF coil 32 current. To do so, the forward voltage $V_f(t)$ at the amplifier may be described with the following equation:

$$V_f(t) = j(1+S)^{-1}XI(t) \qquad (24).$$

Without the matching inductor, from Equations (9), (10), and (23), the following equation may be written:

$$V_f(t) = j\left((1 + S) + \frac{jX}{Z_0}(1 - S)\right)^{-1} XI(t). \qquad (25)$$

The results of Equations (24) and (25) may indicate that the magnetic field produced by the RF coil 32 array may be obtained with an S-parameter measurement, rather than via a time consuming, MR based, transmit gain determination.

To control the current in the coil elements 58 of the RF coil 32, coil losses may be separated from object losses. Based on Equations (16) and (17) above, the coil current vector may be employed to represent power as the sum of a coil term and an object term in the following equations:

$$P(t) = \frac{1}{2}I'(t)ZI(t) \qquad (26)$$

$$= \frac{1}{2}(I'(t)ZcI(t) + I'(t)ZoI(t))$$

$$= Pc(t) + Po(t).$$

Using the S-parameter expressions of Equations (9)-(11), and applying Equation (21) to substitute for the port voltage, the following equation may be written:

$$P(t) = \frac{1}{2}V'_{in}(t)I_{in}(t) \qquad (27)$$

$$= \frac{1}{2Z_0}V'_{in}(t)(1-S)(1+S)^{-1}V_{in}(t)$$

$$= \frac{1}{2Z_0}I'(t)X'(1-S)(1+S)^{-1}XI(t).$$

From Equation (27), the Z matrix may be written as the following equation:

$$Z = X'(1-S)(1+S)^{-1}X/Z_0 \qquad (28).$$

With reference to Equation (17) above, the coil impedance term Zc and the patient impedance term Zo may be obtained from an unloaded RF coil 32 measurement and by subtracting this from the impedance measured with the particular load, as described by the following equation:

$$Zo = X'(1-S)(1+S)^{-1}X/Z_0 - Zc \qquad (29).$$

From Equation (29), the power deposited into the patient Po(t) may be described by the following equation:

$$Po(t) = \frac{1}{2}I'(t)ZoI(t). \qquad (30)$$

It should be noted that the Zo matrix corresponds to the matrix Φ of Equation (7). Exactly how much power may be required for any given MR measurement (specified by I(t)) may be calculated based on Equation (30), and may be further applied for any patient and/or landmark Furthermore, a similar expression may be obtained by substituting Equation (23) into Equation (27).

While power may be calculated from the impedance matrices and coil currents, it may be more direct to employ the port voltages (which are directly proportional to the coil currents) and an admittance description. Based on Equations (9) and (10), above, the port admittance may be derived. By definition, the port admittance may described in the following equation:

$$Y_{in}V_{in}(t) = I_{in}(t) \qquad (31).$$

Equation (31) may be rewritten as follows:

$$Y_{in}(1+S)V_f = (1-S)V_f/Z_0$$

$$\Rightarrow Y_{in} = (1-S)(1+S)^{-1}/Z_0 \qquad (32).$$

The input port admittance definition above is consistent with the second line in the power equation of Equation (27). Thus, based on Equations (28) and (32), the following equation may be written:

$$Z = X'Y_{in}X \qquad (33).$$

The admittance matrix may be further decomposed into the sum of a coil term and an object term as described in the following equation:

$$Y_{in} = Yc + Yo \qquad (34),$$

whereby Yc may be determined using an unloaded S-parameter measurement. Yo may be equal to the loaded input admittance minus the coil admittance term. Thus, power deposited into the patient or other object may be calculated from the following equation:

$$Po(t) = \frac{1}{2}V'_{in}(t)YoV_{in}(t). \qquad (35)$$

Figure 6:
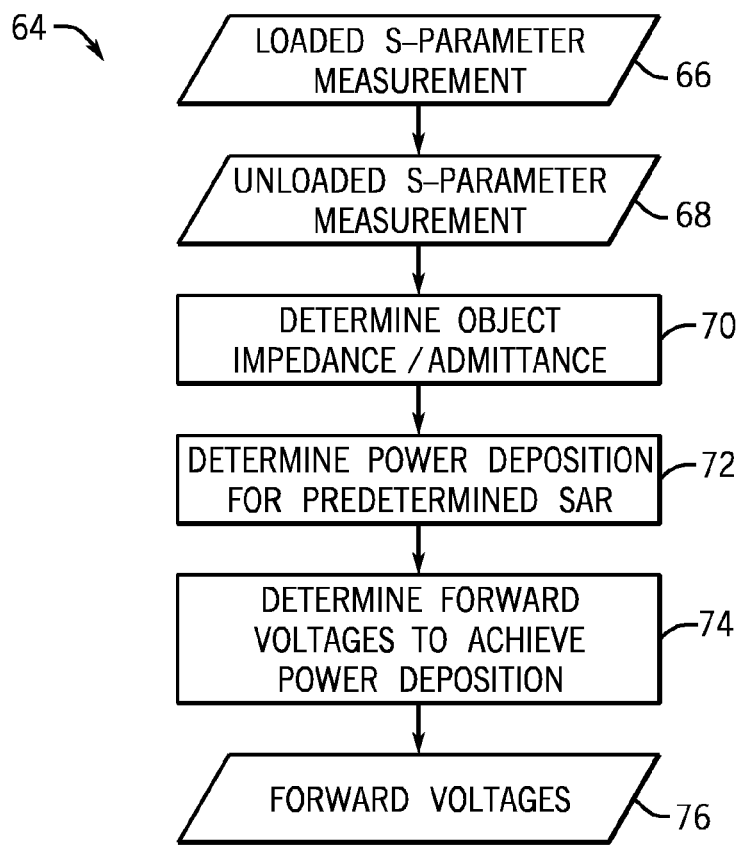
FIG. 6 is a flowchart representing a method for providing an output voltage to control the RF coil to maintain SAR at a desired level, in accordance with aspects of the present invention.

FIG. 6 illustrates a flowchart 64 for providing output forward voltages 76 to control the RF coil 32 such that an SAR for a patient in the scanner 12 is maintained at a predetermined level, based on the relationships illustrated above. Algorithms for performing the steps of the flowchart 64 may be stored and performed by the control circuitry 36, the RF transmit/receive interface, and/or the amplifier 60. For exemplary purposes, the flowchart 64 describes limiting SAR with respect to a patient in the scanner, but the technique may be employed to limit SAR with respect to any object that may be scanned by the scanner 12.

At the start of the flowchart 64, an unloaded measurement 66 of the S-parameters associated with the RF coil 32 may be determined. Though the S-parameters may be typically measured using a vector network analyzer, the RF coil 32 of the scanner 12 may additionally or alternatively be used to determine the S-parameters. For example, by transmitting low powered RF pulses to each coil element 58 sequentially, a complex ratio of forward and reflected voltages may be determined by simultaneously measuring reflected power at every coil element 58, which may enable a determination of the S-parameters.

The unloaded measurement of S-parameters 66 may be determined prior to placement of the patient into the scanner 12 and, consequently, within the RF coil 32. It may be noted that, in addition to being useful for predicting patient SAR and transmit gain, the determined unloaded S-parameters 66 may also be used to determine coil "health." For example, the unloaded S-parameters may be observed to determine whether they are markedly different from port to port. Furthermore, one may identify the presence of coil coupling between transmit coil and receive coil arrays (or other metallic structures within the RF coil 32) which may potentially cause heating issues.

Next, a loaded measurement of S-parameters 68 may be determined, after the patient has been positioned in the scanner 12. The loaded measurement of S-parameters may be determined in the same manner as the unloaded measurement of S-parameters 66. Since the loaded S-parameters measurement 68 may depend on a position of the patient in the scanner 12, the loaded measurement of S-parameters 68 should be performed any time the patient is repositioned.

In step 70, a patient impedance may be determined. Since the unloaded S-parameters 66 may enable a determination of an unloaded RF coil 32 impedance, and the loaded S-parameters 68 may enable a determination of a loaded RF coil 32 impedance, a patient impedance may be determined by subtracting the unloaded impedance from the loaded impedance. Alternatively, for the same reasons, a patient admittance may be instead determined.

In step 72, having obtained the patient impedance, an amount of power that is to be deposited in a patient to maintain a given SAR may be determined. As noted above, SAR depends on the power deposited in the patient and the weight of the patient. A corresponding power deposition may be determined based on a predetermined SAR and the weight of the patient. In step 74, from the power deposition determined in step 72, forward voltages 76 that may be output by the amplifier 60 may be calculated such that the RF coil 32 may output the above-determined patient power deposition, based on the equations provided above. After obtaining the forward voltages 76, the amplifier 60 may output the determined forward voltages to the coil elements 58 of the RF coil 32.

Although the above techniques may be employed for better power monitoring on transmit arrays, such as the RF coil 32 illustrated in FIG. 2, many of the benefits may also apply to conventional quadrature-driven volume coils. It should be noted that a birdcage volume coil may include a quadrature power splitter placed between the coil ports and the RF amplifier. In such a case, the forward voltage may be the voltage at the outputs of the power splitter. When a birdcage volume coil is used, however, it may not be easy to calculate the S-parameter matrix, as the port voltages cannot be individually controlled. An approximate approach may be employed. When using a quadrature power splitter, the S(1,1) term may be assumed to be equal to the S(2,2) term as should be the case in a balanced coil. In this situation, it may be difficult to reliably detect coil imbalances. Further, it should be appreciated that S(1,2) always equals S(2,1). If the monitoring of the forward and reflective port voltages are integrated with the RF amplifier 60, the same mechanisms used for feedback may be also incorporated into SAR prediction, transmit gain setting, and coil health functionality.

Technical effects of the invention include, among other things, more precise control over power deposition into an object, such as a patient, from a radio frequency coil of an magnetic resonance imaging (MRI) scanner and/or more precise prediction of such power deposition. Additionally, the techniques described herein may be employed to determine a general health of the radio frequency coil as well as to ascertain whether extraneous sources may be present, which may cause heating to occur.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A magnetic resonance imaging system comprising:
a radio frequency coil having a plurality of conductive coil elements;
control circuitry configured to determine a plurality of forward voltages using an unloaded measurement of scattering parameters and a loaded measurement of scattering parameters, wherein the unloaded measurement of scattering parameters is obtained when an object is not in the magnetic resonance imaging system and the loaded measurement of scattering parameters is obtained when the object is in the magnetic resonance imaging system, and wherein the plurality of forward voltages cause a deposition of power into the object when the forward voltages are applied respectively to the plurality of coil elements, wherein the deposition of power is within a predetermined specific absorption rate; and
a radio frequency coil amplifier configured to apply the determined plurality of forward voltages respectively to the plurality of coil elements in order to cause the deposition of power into the object.

2. The system of claim 1, wherein the control circuitry is configured to determine an impedance of the object using the unloaded measurement of scattering parameters and the loaded measurement of scattering parameters.

3. The system of claim 1, wherein the control circuitry is configured to predict an amount of power that will be deposited into the object such that the amount of power is within the predetermined specific absorption rate.

4. The system of claim 1, wherein the control circuitry is configured to determine the plurality of forward voltages using a respective plurality of currents through the plurality of coil elements that will cause a predicted amount of power to be deposited.

5. The system of claim 1, comprising a plurality of voltage sensors respectively coupled to cables connecting the plurality of coil elements and the amplifier.

6. The system of claim 5, wherein the plurality of voltage sensors is configured to determine a plurality of reflected voltages that are respectively reflected from the plurality of coil elements.

7. The system of claim 1, wherein the control circuitry is configured to determine the measurement of scattering parameters using a plurality of reflected voltages.

8. A magnetic resonance imaging system comprising:
a radio frequency coil assembly configured to obtain an unloaded measurement of scattering parameters and a loaded measurement of scattering parameters, wherein the unloaded measurement of scattering parameters is obtained when an object is not in the magnetic resonance imaging system and the loaded measurement of scattering parameters is obtained when the object is in the magnetic resonance imaging system; and
where the loaded and unloaded measurements of scattering parameters, permit forward and/or reflected voltages of the radiofrequency coil assembly to be determined.

9. The system of claim 8, wherein the radio frequency coil assembly is configured to predict an amount of power that the radio frequency coil assembly will deposit into the object when one or more forward voltages are applied to the radio frequency coil assembly using the unloaded measurement of scattering parameters and the loaded measurement of scattering parameters.

10. The system of claim 8, wherein the radio frequency coil assembly includes a plurality of conductive coil elements.

11. The system of claim 10, wherein the radio frequency coil includes a plurality of sensors connected respectively to the plurality of conductive coil elements, wherein each of the plurality of sensors is configured to determine a reflected voltage when a forward voltage is applied to the respective one of the plurality of conductive coil elements.

12. The system of claim 10, wherein the radio frequency coil assembly is configured to transmit radio frequency pulses to each conductive coil element sequentially and to simultaneously measure reflected voltage at every coil element.

13. The system of claim 8, wherein the radio frequency coil assembly is configured to determine a measurement of scattering parameters using measurements of reflected voltage at every coil element.

14. A magnetic resonance imaging system comprising:
a radio frequency coil;
an amplifier configured to drive the radio frequency coil with at least one of a forward and/or reflected voltage based on a control signal; and
control circuitry operably connected to the amplifier and configured to provide the control signal to the amplifier, the control circuitry capable of:
receiving an unloaded measurement of scattering parameters of the radio frequency coil obtained when an object is not within the radio frequency coil;
receiving a loaded measurement of scattering parameters of the radio frequency coil obtained when the object is within the radio frequency coil; and
determining the control signal, using the unloaded measurement of scattering parameters and the loaded measurement of scattering parameters, that is predicted to cause the amplifier to drive the radio frequency coil to deposit an amount of power into the object when the object is within the radio frequency coil, wherein the amount of power into the object is within a predetermined specific absorption rate.

15. The system of claim 14, wherein the control circuitry is configured to determine an impedance or an admittance of the object using the unloaded measurement of scattering parameters and the loaded measurement of scattering parameters.

16. The system of claim 14, wherein the radio frequency coil comprises a plurality of conductive coil elements.

17. The system of claim 16, wherein the control signal is configured to cause the amplifier to supply a plurality of forward voltage signals respectively to the plurality of conductive coil elements.

18. The system of claim 16, comprising a plurality of voltage sensors connected respectively to the plurality of conductive coil elements, the plurality of voltage sensors being configured to determine a plurality of voltages reflected respectively from the plurality of conductive coil elements when a plurality of forward voltages are respectively applied to the conductive coil elements.

* * * * *